United States Patent

Aintila

Patent Number: 5,804,456
Date of Patent: Sep. 8, 1998

[54] METHOD AND APPARATUS FOR CHEMICALLY GENERATING TERMINAL BUMPS ON SEMICONDUCTOR WAFERS

[75] Inventor: Ahti Aintila, Lohja, Finland

[73] Assignee: Picopak Oy, Lohja, Finland

[21] Appl. No.: 578,691

[22] PCT Filed: Jul. 6, 1994

[86] PCT No.: PCT/FI94/00313

§ 371 Date: Dec. 28, 1995

§ 102(e) Date: Dec. 28, 1995

[87] PCT Pub. No.: WO95/02257

PCT Pub. Date: Jan. 19, 1995

[30] Foreign Application Priority Data

Jul. 8, 1993 [FI] Finland ..................... 933128

[51] Int. Cl.⁶ .................. H01L 21/44; H01L 21/288
[52] U.S. Cl. ............. 437/183; 204/224 R; 204/297 W; 205/123
[58] Field of Search .............. 437/183; 204/224 R, 204/297 W; 205/123

[56] References Cited

U.S. PATENT DOCUMENTS

| 3,934,054 | 1/1976 | Schmeling et al. . |
|---|---|---|
| 4,152,467 | 5/1979 | Alpaugh et al. . |
| 4,205,099 | 5/1980 | Jones et al. . |
| 4,262,044 | 4/1981 | Kuczma, Jr. . |
| 4,622,917 | 11/1986 | Schramm . |
| 5,077,099 | 12/1991 | Kukanskis et al. . |
| 5,198,089 | 3/1993 | Brueggman ..................... 204/240 |

FOREIGN PATENT DOCUMENTS

| 7-211669 | 8/1995 | Japan . |
| 1052646 | 12/1966 | United Kingdom . |

Primary Examiner—John Niebling
Assistant Examiner—Kevin F. Turner
Attorney, Agent, or Firm—Birch, Stewart, Kolasch & Birch

[57] ABSTRACT

The invention relates to a method and an apparatus for forming bonding bumps on wafers (5) to be plated in an electroless process (not requiring an externally applied voltage). According to the method, the object to be plated is immersed in a vessel (2) containing a desired solution (10) of metal salts thermostatted at a desired temperature. According to the invention, the wafer (5) to be plated is fixed to a filler block (4) which has a volume essentially equal to the volume of the process vessel (2) to the end of reducing the required filling volume of the vessel (2), and said filler block (4) is moved in the vessel (2) for improving the mixing of the solution of metal salts contained therein.

9 Claims, 1 Drawing Sheet

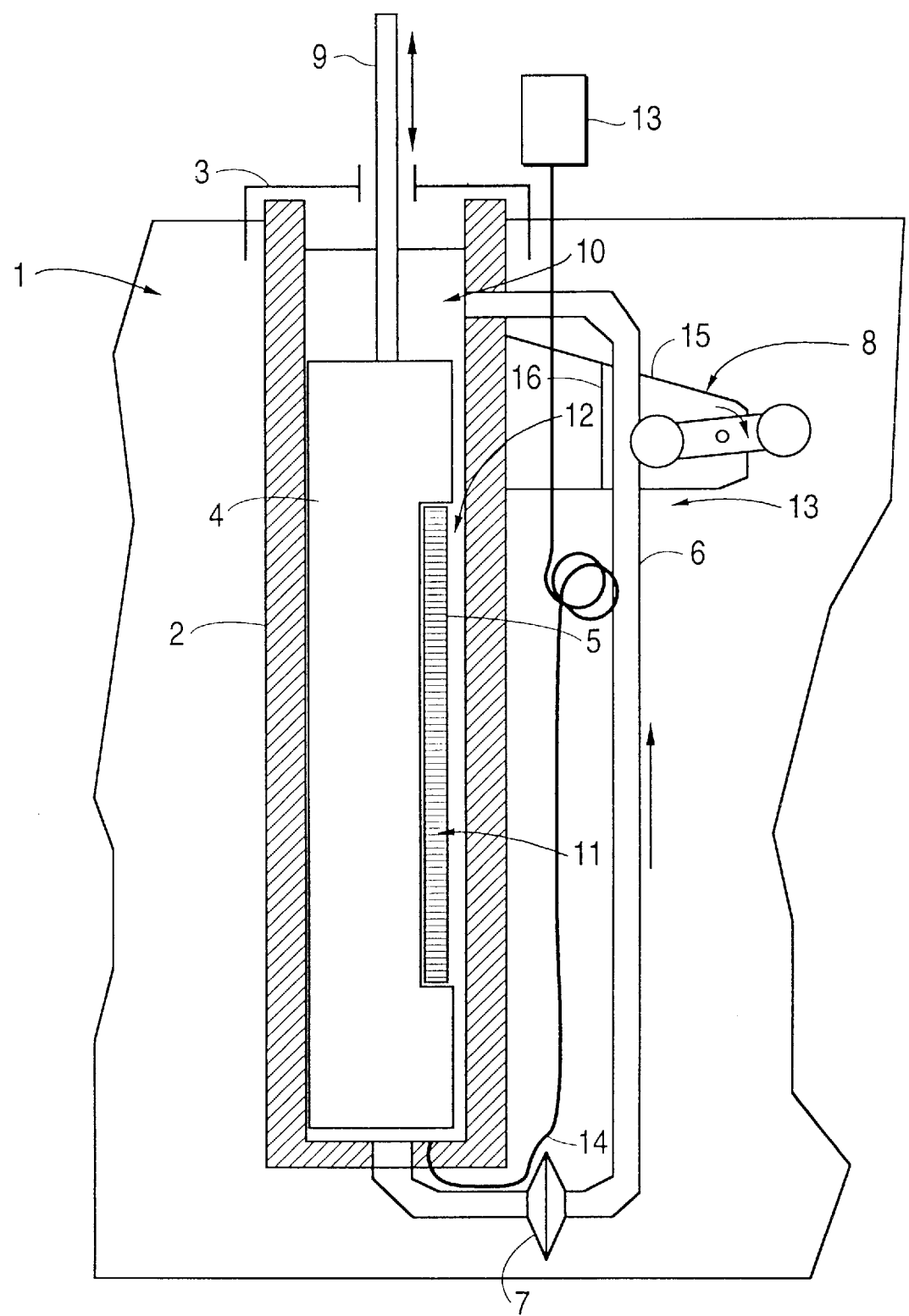

METHOD AND APPARATUS FOR CHEMICALLY GENERATING TERMINAL BUMPS ON SEMICONDUCTOR WAFERS

The present invention relates to a method according to the preamble of claim 1 for electroless plating of bonding bumps on semiconductor wafers.

The method also concerns an apparatus suited for implementing said method.

To achieve a faster and more reliable bonding method (e.g., Tape Automated Bonding (TAB), Flip-Chip Bonding) than the customary wire-bonding directly to the aluminium layer of a semiconductor chip, metallic bonding bumps can be plated on the aluminium bonding areas. Both the electrochemical plating method and the "electroless" plating occurring without the help of an externally applied voltage are well known in the art. However, the electroless plating takes place via an extremely critical process not so much favoured in the formation of bonding bumps on semiconductor wafers.

Bonding bumps made through an electroless plating process typically are 20 $\mu$m thick. Typical metal for the bump is nickel, for instance, on which further is formed a gold, tin or tin-lead layer. Typical deposition times used in the electroless method are from 10 min to 4 hours.

The greatest problem in the electroless process is to achieve the correct ratio of the active plating area to the volume of the aqueous solution of metal salt compounds in the plating system. For instance, to keep a typical nickel-salt-based plating process active requires that the ratio is above 0.25 $dm^2/l$ (that is, 2500 $mm^2/1,000,000$ $mm_3$), while on the other hand, the ratio must be kept smaller than 2.5 $dm^2/l$ (that is, 25,000 $mm^2/1,000,000$ $mm^3$) to avoid overactivation of the plating system, which leads to self-destruction. Typically, when the silicon wafer diameter is, e.g., 100 mm and its area, consequently, 0.785 $dm^2$ (7850 $mm^2$), the total bonding area be plated on it may be as small as 88 $mm^2$, for instance. Hence, the liquid volume in the process should not vary by more than 3520–35200 $mm^3$ per each wafer. In an ideal situation where the sectional area of the process vessel would be exactly equal to the wafer area, the thickness of the plating solution cushion facing the wafer should be kept in the range 0.45–4.5 mm.

A second requirement set for a well-behaved process is that a homogeneous mixing of the plating solution is maintained over the wafer area being processed. Thirdly, the plating process temperature should in a controlled way remain within a certain range in order to maintain the process in working condition and to control the deposition rate. Fourthly, continuous filtering of the plating solution during the process is advisable to remove any eventual precipitated metal nodules formed in the process through self-catalytic action.

It is an object of the present invention to achieve an entirely novel method and apparatus for electroless plating of bonding bumps on semiconductor wafers.

The invention is based on placing the semiconductor wafer on the surface of a piston-like element situated in the process vessel, whereby the volume entailed by the piston clearance and a circulation apparatus is dimensioned to correspond to the liquid volume required of the process. Movement of the piston achieves the required circulation of the plating solution.

More specifically, the method according to the invention is characterized by what is stated in the characterizing part of claim 1.

Furthermore, the apparatus according to the invention is characterized by what is stated in the characterizing part of claim 5.

The invention offers significant benefits.

The present method fulfills the liquid volume requirements set by the process. Moreover, the piston-like arrangement ensures sufficient liquid circulation and a side circulation offers the removal of precipitated metal nodules from the plating solution. The the small process vessel placed in a thermostatted water bath, can be used to accurately control the temperature of the process.

Compared to the electrochemical plating process, a significant number of process steps are eliminated. Obviated are such steps as the thin-film deposition, the masking steps, the resist development steps and the resist removal step.

In the following the invention will be examined in greater detail with the help of an exemplifying embodiment illustrated in the appended drawing.

With special attention to the process requirements, an apparatus according to the invention has been designed with the construction shown in the diagram for electroless metallization and particularly the plating of bonding bumps on semiconductor wafers based on the following operational principles:

1. To a process vessel 2 typically having a rectangular horizontal cross section is adapted a reciprocatingly movable piston 4 having a cross section matching that of the process vessel. To a recess 11 at the broad side of the piston 4 is fixed a wafer-like object 5 which in the illustrated case is a semiconductor wafer. Between the piston 4 and the process vessel 2, on the side of the piston carrying the semiconductor wafer 5, is adapted a narrow flow channel 12 through which the plating solution 10 contained in the process vessel can flow reciprocatingly past the surface being plated when the piston 4 is moved reciprocatingly in the vessel so that a mixing effect of the plating solution is attained. The mutual dimensioning of the stroke of the piston 4, the cross section of the vessel 2 and the flow channel 12 is implemented so that at least the liquid volume contained within the area of the wafer 5 being plated is entirely replaced during each stroke of the piston 4 from its one extreme position to the other. The process vessel 2 is closed by a cover 3 to minimize thermal and liquid evaporation losses. The cover 3 has a hole through which a shaft 9 connected to the piston 4 is adapted in a vertically movable fashion. The motion of the shaft 9 can be implemented by means of, e.g., a cam connected to a rotating motor.

2. To the process vessel 2 is arranged a filtering circulation 13 implemented by means of a peristaltic pump 8, a filter 7 and a heat and chemicals resistant tubing 6 to the end of removing precipitated metal particulates and other solid impurities. The pump 8 is connected via a recess 15 to the vessel 2 and the recess 15 has a backing surface 16 against which the pump cam can compress the tubing 6 to achieve the pumped flow. In addition to the filtration function, the filtering circulation 13 also homogenizes the concentration and temperature gradient of the active portion of the plating solution in the process vessel 2.

3. The process vessel 2 with its filtering circulation 13 is immersed in a thermostatted water bath 1 which is kept to an exactly known and throughout homogeneous temperature gradient by means of, e.g., electric heaters and vigorous agitation. Heat is effectively transferred to the process vessel 2 via the walls of the process vessel 2, the pump tubing 6 and the filter 7, all of which are immersed in the thermostatted water bath 1.

4. To avoid larger temperature variations in the small volume of the active portion 10 of the plating solution contained in the process vessel 2, the pistons 4 with the semiconductor wafers 5 fixed to them are preheated in a flushing vessel located in the same thermostatted water bath 1 and then transferred to the process vessel 2.

5. The hydrogen gas released in the process easily forms bubbles on the areas to be plated. Such bubbling may cause pinholes in the plated areas. To avoid this, the apparatus is provided with a gas pump 13 suited for pumping an agitating gas flow via a hose 14 to the bottom of the process vessel 2. The hose 14 is dimensioned with sufficient length to allow the pumped gas to attain the water bath temperature. The agitating gas is appropriately an inert gas or a mixture thereof such as nitrogen or air. The oxygen contained in air combines with the hydrogen to form water, thus achieving effective elimination of the hydrogen bubbles emerging in the process. Also a simple bubbling with the agitating gas is an effective method of detaching the emerging hydrogen bubbles. Furthermore, bubbling improves the circulation of the plating solution, whereby thermal and concentration gradients are equalized.

Alternatively, the peristaltic tubing pump 8 can be replaced by any simple pumping arrangement.

For effective sealing of the cover 3, the vertical position of the process vessel is the most advantageous. Even other operating positions are possible, however, provided that the leakproofness of the liquid volume and a homogenous liquid layer over the entire area of the wafer to be plated can be assured.

I claim:

1. A method for forming bonding bumps on the metallized aluminium surfaces of a wafer (5) to be plated in an electroless process (not requiring an externally applied voltage), in which method the object to be plated is immersed in a process vessel (2) containing a plating solution (10) of metal salts thermostatted at a temperature, characterized by comprising:

placing the wafer (5) to be plated in a filler block (4) having a volume essentially equal to the volume of the process vessel (2) for reducing a required filling volume of the process vessel (2), and moving said filler block (4) in the process vessel (2) for improving the mixing of said solution of metal salts.

2. A method as defined in claim 1, characterized by circulating the liquid (10) contained in the process vessel (2) via a side circulation (13) to the end of equalizing concentration and thermal gradients of the solution (10) and achieving a filtering thereof.

3. A method as defined in claim 1, characterized by having said process vessel (2) placed in a thermostatted liquid bath (1) to the end of equalizing the process temperature.

4. A method as defined in claim 2, characterized by augmenting the side circulation by means of a peristaltic pump (8).

5. An apparatus for forming bonding bumps on wafers (5) to be plated in an electroless process (not requiring an externally applied voltage), said apparatus comprising:

a process vessel (2) in which said wafer (5) can be immersed, characterized by a filler block (4) having a volume essentially equal to a volume of the process vessel (2), to which filler block (4) said wafer (5) to be plated can be fixed, for reducing a required filling volume of the process vessel (2), and a side circulation (13) adapted to the process vessel (2) and suited to provide the circulation of the liquid (10) contained in the process vessel (2).

6. An apparatus as defined in claim 5, characterized by having such a structure of the filler block (4) that aligns the wafer (5) in an essentially vertical position.

7. An apparatus as defined in claim 5, characterized by comprising a pump (8) and a filtering assembly in the side circulation (13).

8. An apparatus as defined in claim 7, characterized by using a peristaltic pump as the pump (8).

9. An apparatus as defined in claim 5, characterized in that said apparatus incorporates a gas pump (13) for routing an agitating gas flow to a bottom of the process vessel (2) to the end of removing emerging hydrogen bubbles.

* * * * *